United States Patent [19]
Belcher et al.

[11] Patent Number: 5,705,041
[45] Date of Patent: Jan. 6, 1998

[54] METHOD OF MINIMIZING SURFACE EFFECTS IN THIN FERROELECTRICS

[75] Inventors: James F. Belcher, Plano; Howard R. Beratan, Richardson, both of Tex.

[73] Assignee: Texas Instruments Incorporated, Dallas, Tex.

[21] Appl. No.: 225,601

[22] Filed: Apr. 7, 1994

[51] Int. Cl.[6] .................................................. C23L 14/00
[52] U.S. Cl. .................................................. 204/192.1
[58] Field of Search ........................... 156/903; 257/632, 257/311, 295; 204/192.1; 427/250, 307, 535

[56] References Cited

U.S. PATENT DOCUMENTS 5,578,867  11/1996  Argos, Jr. et al. .

*Primary Examiner*—Charles T. Jordan
*Assistant Examiner*—Anthony R. Chi
*Attorney, Agent, or Firm*—René E. Grossman; Richard L. Donaldson

[57] ABSTRACT

A method of improving the responsivity of a pyroelectric device including providing a pyroelectric element of less than maximum theoretical density having holes therein extending to a surface of the element and having contaminants at the surface (22), cleaning the contaminants from the surface and metallizing the surface prior to contaminant reformation on the surface. The pyroelectric element is preferably a ferroelectric element and preferably barium strontium titanate. The step of cleaning can be by oxygen plasma, acid etch or a combination thereof. When the combination of cleaning steps is used, the step of cleaning comprises etching the surface and then oxygen cleaning the surface.

21 Claims, 1 Drawing Sheet

METHOD OF MINIMIZING SURFACE EFFECTS IN THIN FERROELECTRICS

CROSS REFERENCE TO PENDING APPLICATIONS

This application is related to an application entitled Chemical Polishing of Barium Strontium Titanate (TI-17945) filed concurrently herewith, the contents of which are incorporated herein by reference.

BACKGROUND OF THE INVENTION

1. Field of the Invention

This invention relates to a method of minimizing surface effects in pyroelectric devices and primarily in ferroelectric devices.

2. Brief Description of the Prior Art

Improvement in the responsivity of pyroelectric devices and pyroelectric detectors, in particular, is a constant goal. While the invention as will be described herein below relates to pyroelectric materials in general, the discussion will be provided with respect to ferroelectric materials and to barium strontium titanate (BST) in particular as the preferred ferroelectric material.

Ferroelectric materials are generally utilized in the production of focal plane array detectors of the uncooled type, DRAMs, electro-optic devices, capacitors, piezoelectric devices and other known devices. The ferroelectric materials as utilized generally are not at 100% of theoretical density (generally from about 93% to less than 100% of theoretical density) and therefore contain holes therein, some of which extend to the surface of the material. These holes can trap processing materials and/or materials in the atmosphere which are contaminants. In addition, contaminant can build up on the surface of the ferroelectric material, these materials generally being, but not limited to, hydrocarbons. Such contaminants can be present even when processing has taken place in a vacuum system. These contaminants have a detrimental effect in that they interfere with the ability of metallization on the ferroelectric material to make good ohmic contact between the ferroelectric material and an electrode. In the case of a detector, the contaminants cause a decrease in the measure of responsivity of the detector which is voltage response per unit ferroelectric material thickness per unit temperature change.

Since BST as well as the ferroelectric materials generally used are polycrystalline, etching is not a proper solution to the problem since etching of polycrystalline materials forms an uneven surface. Grinding and/or polishing of a ferroelectric material causes surface dislocations (mechanical damage) which should be removed to provide the material with a damage-free surface and desirable properties.

The prior art has used oxygen to perform cleaning steps per se in semiconductor technology, however oxygen cleaning is not known to have been used in the prior art to improve device performance or, specifically, to improve performance of focal plane array detectors.

SUMMARY OF THE INVENTION

In accordance with the present invention, there are provided processing techniques whereby both the responsivity as well as the dielectric properties of ferroelectric materials are materially improved.

Briefly, the surface of the ferroelectric material is modified to thereby improve the performance thereof. This is accomplished by removing the contaminants prior to the metallization step with the metallization step taking place prior to the reintroduction of contaminants onto the ferroelectric material surface.

The approach to accomplish this modification is twofold. The first approach is to operate from the surface out, this entailing removal of layers of contaminants that are adsorbed onto the surface of the ferroelectric material by use of an oxygen plasma prior to metallization in situ with the metallization being applied immediately after the cleaning and before the buildup of contaminants onto the ferroelectric material surface. The source of the contaminants may be environmental or solvents entrapped in material porosity. For example, a reverse bias can be used in a sputtering machine or by ultraviolet activation of oxygen. Other oxidizing gases could be used in place of oxygen such as, for example, nitrous oxide. Since contaminant build up is about 1 to 2% per hour even in a high vacuum chamber, about $1 \times 10^{-8}$ Torr, the metallization step should theoretically take place within a few minutes after cleaning, preferably up to about fifteen minutes after cleaning so that the build up is no more than a fraction of one percent.

In addition, the dislocations caused by grinding and/or polishing during prior fabrication steps should also be removed. This is accomplished by the use of an acid etch wherein the acid having a concentration of from about 0.01% to about 50%, preferably hydrofluoric acid for about 20 minutes with a 1% acid solution and for about 25 minutes with a 0.5% acid solution or vice versa. The times will vary, depending upon acid concentration. It is possible that the acid treatment modifies the surface chemistry of the ferroelectric material in addition to removal of a portion of the surface to remove dislocation damage as well as providing the step of removing the contaminants disposed on and within holes at the surface. In this regard, a functional group from the etchant acid may be implanted into a shallow region of the ferroelectric material surface during dislocation removal. In addition, both the first and second approaches as discussed above can be used. In this case, the oxygen cleaning procedure would follow the etching procedure with metallization following in all cases.

A reduction in loss tangent noise is obtained upon surface treatment by modifying the apparent dielectric properties. This improvement results either from an increase in the dielectric constant or a decrease in the loss tangent. For a system that is detector loss tangent limited, the signal to noise ratio, independent of signal processing, is proportional to:

$$[Cd/\tan d]^{1/2} \, dE/dT$$

where:

Cd is the detector capacitance tan d is the detector loss tangent dE/dT is the detector field responsivity in units of volts/unit thickness/unit temperature change.

This function improves in direct proportion with dE/dT and as the square root of the ratio between Cd and Tan d, th^E latte^R two factors determining the noise. Surface treatment affects all of these factors, increasing signal and lessening noise by increasing the capacitance and lowering the loss tangent.

In summary, improved performance is obtained in accordance with the present invention by (1) removing contaminants from the surface of the ferroelectric material, (2) removing polishing damage in the form of dislocations and (3) modification of the surface chemistry of the ferroelectric material. The oxygen cleaning step provides about 35 to 40% material responsivity increase, the acid etch treatment also provides about 35 to 40% material responsivity increase and the combination provides a responsivity increase which is approximately the product of the oxygen cleaning and acid etch treatments.

DESCRIPTION OF THE PREFERRED EMBODIMENT

Figure 1:
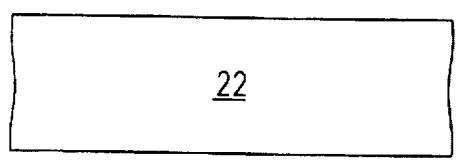
FIGS. 1 to 9 describe the process flow required to provide a detector in accordance with the present invention.
Figure 5:
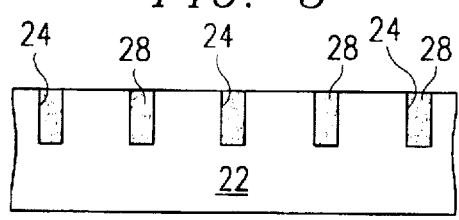
Figure 2:
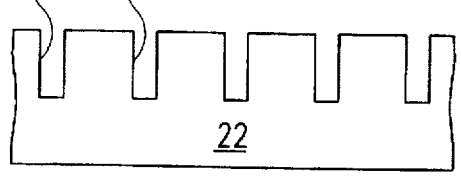
Figure 3:
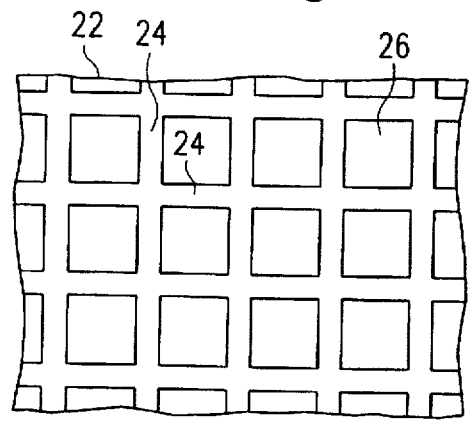
Figure 4:
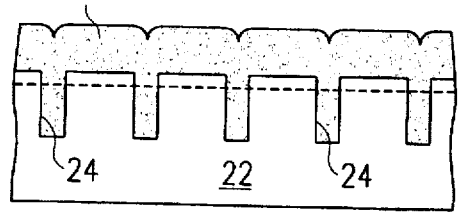

To fabricate a device in accordance with the present invention and, in particular, a focal plane array detector, a die 22 is initially formed from bulk material, the die in accordance with the preferred embodiment being a rectangular parallelepiped of doped barium strontium titanate (BST) as shown in FIG. 1. A surface of the die 22 is polished and an x-y pattern is written onto the polished surface of the die, preferably with a laser, (known as reticulation) as shown in FIGS. 2 and 3 by the grooves 24 to form pixel regions 26 in a matrix arrangement. Ultraviolet photo stimulated etching or ion milling can also be used in place of the laser to provide the reticulation. If ion milling or photo stimulated etching is used, the process flow described hereinbelow would be somewhat altered as is well known. Any residue from the reticulated grooves resulting from laser groove formation is removed by standard acid etching techniques using hydrofluoric acid as the etchant. The grooves 24 are then filled with an organic material 28 which has substantially the same coefficient of thermal expansion as the substrate 22 or which is sufficiently soft so as not to break apart the array during processing and which has a low Young's modulus relative to BST such as, for example, poly-paraxylenes, poly-(dichloro-xylene), poly(p-xylylene) and poly-(chloro-p-xylylene), the latter being preferred, and which extends over the surface of the die 22 as shown in FIG. 4. The organic material 28 over the die 22 and a portion of the die immediately below the organic material 28 are then removed by mechanical polishing to the dashed line in FIG. 4 to provide a die 22 with grooves 24 filled with organic material 28 as shown in FIG. 5. The organic material 28 forms a continuous matrix that holds the pixels 26 in place and maintains pixel orientation during further processing. The exposed surface of the BST substrate 22 is now ready to be treated by the oxygen plasma, the chemical etching process or both, in accordance with the present invention. The optical coating placed on top of the exposed surface of the BST substrate 22 is the surface that absorbs the radiation from a scene in the case of a detector. The exposed surface of the BST is treated by the oxygen plasma prior to the optical coating being placed thereon.

The oxygen plasma cleaning involves a back sputtering in situ in a vacuum chamber wherein the surface of the substrate 22 is ion milled with an ion mill mounted on a Sloan Technology "sideshooter" magnetron sputter system. The ion mill used to mill the surface of the substrates prior to metallization is a Techniques MIM TLA-20 mill. The partial pressure of oxygen is $5 \times 10^{-5}$ Torr. The plasma generator controlling the voltage to the mill was set at 65 volts, 7 amperes. The source voltage varied from 18 to 23 volts and the current varied from 16 to 20 amperes. The ion acceleration was set at 500 volts, 0.8 amperes. The neutralizer was 60 volts, 4 amperes. The ion focus was 200 volts, 25 amperes. The major items that affect these numbers are the filament erosion in the ion mill source and on the neutralizer filament and the pumping capacity. There are many other parameters such as distance to the substrates and erosion of the grids in the mill that also vary these numbers. Metallization 32 of FIG. 6 is sputtered onto the surface of the substrate 22 after the oxygen plasma cleaning.

The etching procedure requires etching of the surface of the substrate 22 in standard manner. The metallization 32 is provided by sputtering as in the case of the oxygen plasma cleaning.

If both etching and oxygen plasma cleaning are to be used, the etching step takes place first with the oxygen plasma cleaning then taking place in situ immediately prior to the sputtering metallization 32.

Figure 6:
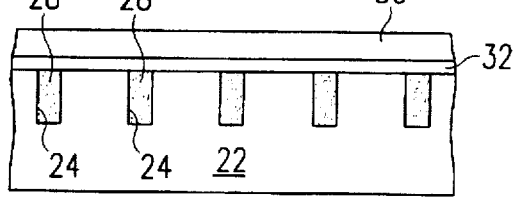

The metallization layer 32 as discussed above, which is preferably TiW or nichrome, is shown in FIG. 6. The metallization 32 forms a good contact with the BST substrate 22, is a reflector in the infrared frequency range, has matched thermal and electrical conduction and has a thickness of from about 500 to about 2000 angstroms and preferably closer to 500 angstroms. A dielectric layer 30 is then formed in standard manner, such as by chemical vapor deposition (CVD), spinning polyimid, sputtering $SiO_2$ over the metallization 32. A further semitransparent layer (not shown), similar to layer 32 of about 50 angstroms can be placed over the dielectric layer 30 and a still further dielectric layer (not shown), similar to layer 30 of about 1 micron can be placed over the further semitransparent layer. This forms a tuned cavity absorber with the metallization 32 that absorbs generally in the 7.5 to 14 micron wavelength range and has a thickness of about one-fourth wavelength at those wavelengths. The dielectric layer 30 can be parylene, an oxide or a polyimide and is preferably parylene.

Figure 7:
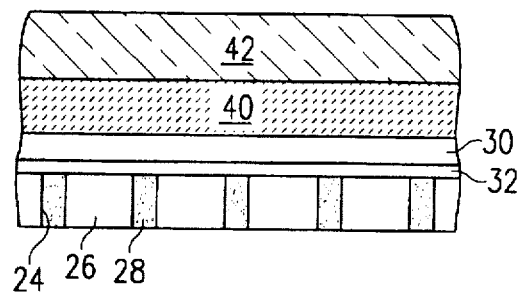
Figure 8:
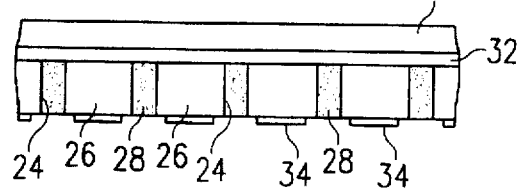
Figure 9:
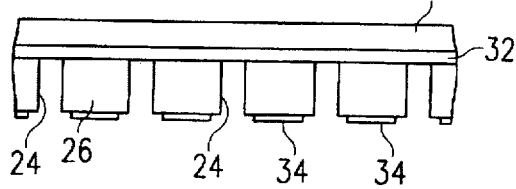

The bottom portion or pad side of FIG. 6 is then removed by polishing up to the reticulation 24 as shown in FIG. 7 so that each pixel 26 is now free standing and physically isolated from the other pixels of the die 22. A layer of wax 40, preferably USS 300 which is a glycol phthalate including phthalic acid and ethylene glycol, is then melted over the layers 30 and 32 and the additional layers (not shown) as discussed above. A layer of glass 42 having thermal expansion closely matched to that of the substrate 22, preferably Schott F1 glass, is then pressed over the wax layer 40 to form a thin continuous wax bond line of several microns. The substrate 22 is than mechanically polished and etched back from the bottom as shown in FIG. 7 to a substrate thickness of from about 0.0005 to about 0.001 inch. The exposed surfaces or pad side of the substrate 22 are then subjected to the oxygen cleaning, acid etch treatment or both as discussed above on the common electrode metalization 32 side. Electrodes 34, which are preferably stacked layers of TiW, nichrome, gold and optionally indium, in that order, are then disposed on the pad side of each of the pixels 26 in standard manner to provide the structure as shown in FIG. 8. The organic material 28 is then removed from the grooves 24 by reactive ion etching using $CF_4/O_2$ plasma chemistry in standard manner or other suitable plasma removal to provide the structure of FIG. 9. The structure of FIG. 9 is then coupled to indium bumps or the like of a silicon semiconductor integrated circuit chip on a pixel by pixel basis in standard manner to provide a completed detector for a focal plane array.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A method of improving the responsivity of a pyroelectric device comprising the steps of:
   (a) providing a pyroelectric element having at least one of contaminants and dislocations at a surface thereof;
   (b) removing said at least one of contaminants and dislocations from said surface; and
   (c) metallizing said surface to a thickness of from about 50 angstroms to about 2000 angstroms prior to contaminant reformation on said surface.

2. The method of claim 1 wherein said pyroelectric element is of less than maximum theoretical density and has holes therein, at least some of which extend to said surface of said element.

3. The method of claim 1 wherein said pyroelectric element is ferroelectric.

4. The method of claim 2 wherein said pyroelectric element is ferroelectric.

5. The method of claim 3 wherein said ferroelectric element is barium strontium titanate.

6. The method of claim 4 wherein said ferroelectric element is barium strontium titanate.

7. The method of claim 1 wherein said step of metallizing is completed within about one minute after said step of removing.

8. The method of claim 2 wherein said step of metallizing is completed within about one minute after said step of removing.

9. The method of claim 3 wherein said step of metallizing is completed within about one minute after said step of removing.

10. The method of claim 4 wherein said step of metallizing is completed within about one minute after said step of removing.

11. The method of claim 5 wherein said step of removing comprises an oxygen plasma cleaning.

12. The method of claim 6 wherein said step of removing comprises an oxygen plasma cleaning.

13. The method of claim 1 wherein said step of removing comprises etching said surface with hydrofluoric acid having a concentration of from about 0.01% to about 50%.

14. The method of claim 2 wherein said step of removing comprises etching said surface with hydrofluoric acid having a concentration of from about 0.01% to about 50%.

15. The method of claim 6 wherein said step of removing comprises etching said surface with hydrofluoric acid having a concentration of from about 0.01% to about 50%.

16. The method of claim 1 wherein said step of removing comprises etching said surface with hydrofluoric acid having a concentration of from about 0.01% to about 50% and then oxygen cleaning said surface.

17. The method of claim 2 wherein said step of removing comprises etching said surface with hydrofluoric acid having a concentration of from about 0.01% to about 50% and then oxygen cleaning said surface.

18. The method of claim 6 wherein said step of removing comprises etching said surface with hydrofluoric acid having a concentration of from about 0.01% to about 50% and then oxygen cleaning said surface.

19. The method of claim 1 wherein said surface includes dislocations therebelow, wherein said removing step comprises removal of contaminants from said surface and modifying the chemistry of said surface.

20. The method of claim 2 wherein said surface includes dislocations therebelow, wherein said removing step comprises removal of contaminants from said surface and modifying the chemistry of said surface.

21. The method of claim 6 wherein said surface includes dislocations therebelow, wherein said removing step comprises removal of contaminants from said surface and modifying the chemistry of said surface.

* * * * *